US007142397B1

(12) United States Patent
Venk (10) Patent No.: US 7,142,397 B1
(45) Date of Patent: Nov. 28, 2006

(54) FLEX CIRCUIT ASSEMBLY WITH AN INTEGRATED CIRCUIT DEVICE ATTACHED TO A BASE FILM WITH AN UNDERFILL PORTION AND SEALED WITH A GLOB TOP PORTION

(75) Inventor: Sridharan Venk, San Jose, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 120 days.

(21) Appl. No.: 10/609,062

(22) Filed: Jun. 27, 2003

(51) Int. Cl.
*G11B 21/16* (2006.01)

(52) U.S. Cl. .................................................. 360/264.2

(58) Field of Classification Search ................ 438/108, 438/113, 118; 257/702, 692; 324/758; 360/264.2; 361/685; 29/840; 156/250
See application file for complete search history.

(56) References Cited

U.S. PATENT DOCUMENTS

| 5,733,800 | A  | * | 3/1998  | Moden  | 438/118 |
| 5,895,968 | A  | * | 4/1999  | Barber | 257/692 |
| 6,025,988 | A  | * | 2/2000  | Yan    | 361/685 |
| 6,337,227 | B1 | * | 1/2002  | Ball   | 438/113 |
| 6,395,121 | B1 | * | 5/2002  | De Bastiani | 156/250 |
| 6,434,817 | B1 | * | 8/2002  | Feigenbaum et al. | 29/840 |
| 6,455,354 | B1 | * | 9/2002  | Jiang  | 438/118 |
| 6,529,027 | B1 | * | 3/2003  | Akram et al. | 324/758 |
| 2003/0094690 | A1 | * | 5/2003 | Dickey et al. | 257/702 |
| 2003/0207495 | A1 | * | 11/2003 | Akram | 438/108 |

OTHER PUBLICATIONS

Web search report. 1 page.*
Web search report II.*

* cited by examiner

*Primary Examiner*—Tianjie Chen (57) ABSTRACT

A flex circuit assembly includes a flex circuit base film. The flex circuit assembly includes an integrated circuit device disposed adjacent the flex circuit base film and including a solder bump connection. The flex circuit assembly includes an electrically conductive trace disposed upon the base film. The trace includes a contact pad. The contact pad is electrically connected to the solder bump connection. The flex circuit assembly includes an underfill portion disposed between the base film and the integrated circuit device for attaching the integrated circuit device to the base film. The underfill portion is formed of an underfill material. The flex circuit assembly includes a glob top portion material disposed upon the underfill portion and the base film for sealing the electrically conductive trace. The glob top portion is formed of a glob top material. The glob top material is different than the underfill material.

15 Claims, 8 Drawing Sheets

FLEX CIRCUIT ASSEMBLY WITH AN INTEGRATED CIRCUIT DEVICE ATTACHED TO A BASE FILM WITH AN UNDERFILL PORTION AND SEALED WITH A GLOB TOP PORTION

BACKGROUND OF THE INVENTION

1. Field of the Invention

The present invention relates generally to disk drives, and in particular to a disk drive including a flex circuit assembly with an integrated circuit device attached to a base film with an underfill portion and sealed with a glob top portion.

2. Description of the Prior Art

The typical hard disk drive includes a head disk assembly (HDA) and a printed circuit board assembly (PCBA) attached to a disk drive base of the HDA. The head disk assembly includes at least one magnetic disk, a spindle motor for rotating the disk, and a head stack assembly (HSA). The printed circuit board assembly includes a servo control system in the form of a disk controller for generating servo control signals. The head stack assembly includes at least one transducer head, typically several, for reading and writing data from and to the disk. The head stack assembly is controllably positioned in response to the generated servo control signals from the disk controller. In so doing, the attached heads are moved relative to tracks disposed upon the disk.

The head stack assembly includes an actuator assembly, at least one head gimbal assembly, and a flex circuit assembly. A conventional "rotary" or "swing-type" actuator assembly typically includes a rotary actuator having an actuator body. The actuator body has a bore and a pivot bearing cartridge engaged within the bore to facilitate rotational movement of the actuator assembly between limited positions about an axis of rotation. A coil support extends from one side of the actuator body. An actuator coil is supported by the coil support and is configured to interact with one or more permanent magnets to form a voice coil motor. One or more actuator arms extend from an opposite side of the actuator body. Each head gimbal assembly includes a transducer head, typically a magneto-resistive ("MR") head, which is distally attached to each of the actuator arms. Each magnetic disk includes opposing disk surfaces. Data may be recorded along data annular regions on a single disk surface or both. As such, the head stack assembly may be pivoted such that each transducer head is disposed adjacent to the various data annular regions from adjacent to the outer diameter to the inner diameter of each disk.

The flex circuit assembly is configured (1) to supply current to the actuator coil and (2) to carry signals between the transducer heads and the printed circuit board assembly. The flex circuit assembly includes a flex circuit (also referred to as a flex circuit cable), an integrated circuit, and a flex circuit connector. The flex circuit includes a dynamic loop portion that is supported by a cable guide. This configuration permits relatively free rotation of the overall head stack assembly.

At one end of the flex circuit there is provided a mounting portion which is attached to a side of the actuator body. Adjacent to the mounting portion, the flex circuit contains a terminal pad portion for connecting a plurality of electrically conductive traces embedded within the flex circuit to electrical connectors, such as insulated wires. The wires extend along the actuator arms to each transducer head for transmitting data signals to and from the transducer heads. At an opposing end of the flex circuit, there is provided a flex circuit connector that is attached to the disk drive base and electrically connected to the printed circuit board assembly.

The flex circuit typically includes a base film, a plurality of electrically conductive traces and a cover film. The base film and the cover film are commonly formed of a polyimide material. The electrically conductive traces are formed upon base film. The cover film is then selectively disposed over the metal traces and the base film for electrically insulating the traces. Adjacent to the mounting portion of the flex circuit, the cover film includes an opening. Within this opening the integrated circuit in the form of an integrated circuit device is attached to the base film and is electrically connected to the traces. The integrated circuit device includes a preamplifier for enhancing signals passed from the transducer heads.

One type of integrated circuit devices includes a die which is electrically connected to a plurality of solder bumps disposed along a bottom face of the device. The solder bumps correspond to pads formed in the traces. When attaching the integrated circuit device to the base film, an underfill material is commonly used. The amount of underfill material is carefully dispensed as it is considered to be relatively expensive. While the opening formed in the cover film allows access to the traces for the attachment of the integrated circuit device, the metal traces are exposed at such region between the underfill material and the opening. In a follow-up touch up process, the same underfill material is typically used to cover these exposed traces. Accordingly, there is a need in the art for an improved flex circuit assembly configuration in comparison to the prior art.

SUMMARY OF THE INVENTION

An aspect of the present invention can be regarded as a flex circuit assembly for use in a head stack assembly. The flex circuit assembly includes a flex circuit base film. The flex circuit assembly further includes an integrated circuit device disposed adjacent the flex circuit base film and including a solder bump connection. The flex circuit assembly further includes an electrically conductive trace disposed upon the flex circuit base film. The trace includes a contact pad, and the contact pad is electrically connected to the solder bump connection. The flex circuit assembly further includes an underfill portion disposed between the flex circuit base film and the integrated circuit device for attaching the integrated circuit device to the flex circuit base film. The underfill portion is formed of an underfill material. The flex circuit assembly further includes a glob top portion disposed upon the underfill portion and the flex circuit base film for sealing the electrically conductive trace. The glob top portion is formed of a glob top material, and the glob top material is different than the underfill material.

According to various embodiments, the underfill material may be a no-flow encapsulant or a capillary flow encapsulant. The flex circuit assembly may further include a flex circuit cover film disposed upon the flex circuit base film. The flex circuit cover film includes an opening, and the integrated circuit device and the electrically conductive trace are disposed within the opening. The underfill portion and the glob top portion may be disposed within the opening. The underfill portion may have a coefficient of thermal expansion between coefficients of thermal expansion of the integrated circuit device and the flex circuit base film. Further, the underfill portion may have a coefficient of thermal expansion greater than a coefficient of thermal expansion of the glob top portion.

According to another aspect of the invention there is provided a head stack assembly for use with a disk drive. The head stack assembly includes a rotary actuator and the above described flex circuit assembly attached to the rotary actuator. According to another aspect of the invention there is provided a disk drive. The disk drive includes a disk drive base and the above described head stack assembly rotatably coupled to the disk drive base.

DESCRIPTION OF THE PREFERRED EMBODIMENTS

Referring now to the drawings wherein the showings are for purposes of illustrating preferred embodiments of the present invention only, and not for purposes of limiting the same, FIGS. 1–9 illustrate a disk drive and a flex circuit assembly in accordance with the aspects of the present invention.

Figure 1:
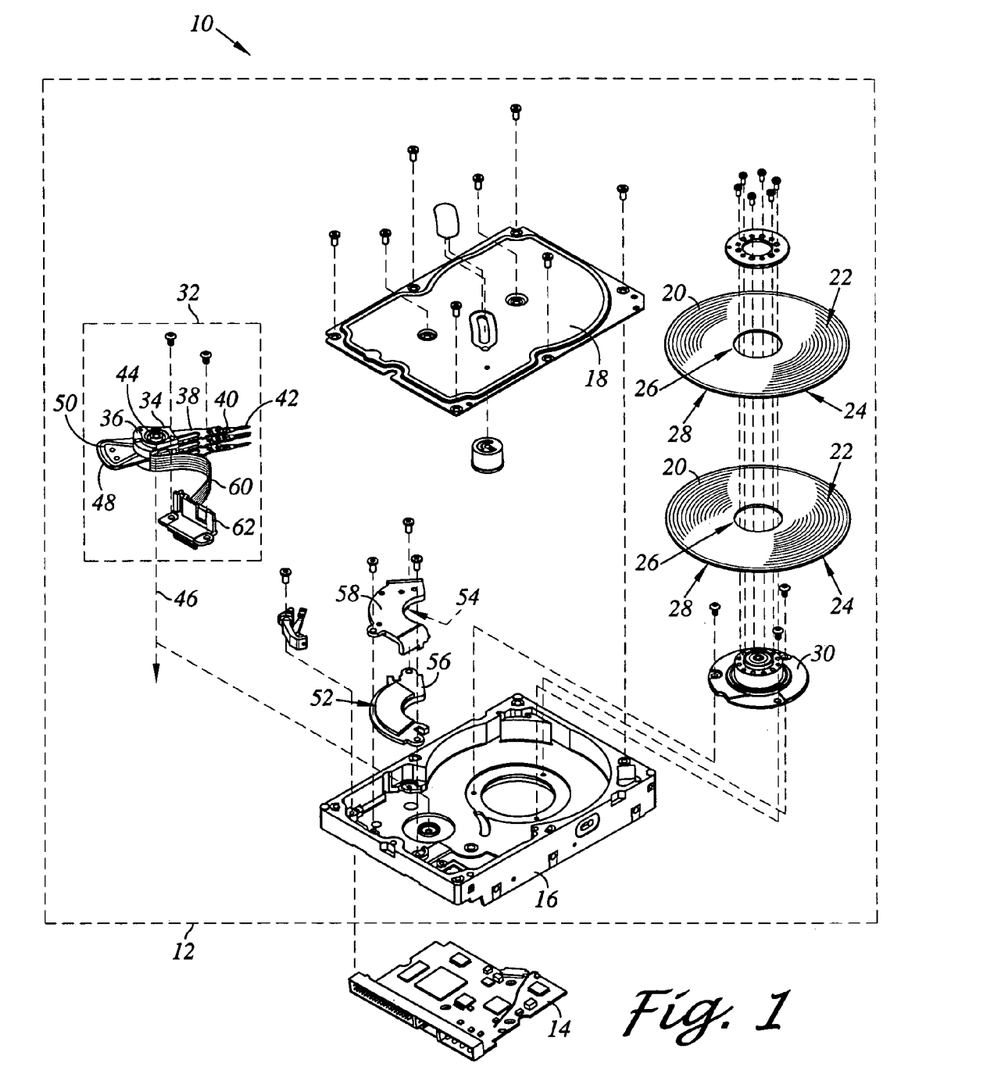
FIG. 1 is an exploded perspective view of a disk drive including a head stack assembly in accordance with an aspect of the present invention.

Referring now to FIG. 1, there is depicted an exploded perspective view of a disk drive 10 as constructed in accordance with an aspect of the present invention. The disk drive 10 includes a head disk assembly (HDA) 12 and a printed circuit board assembly (PCBA) 14. The head disk assembly 12 includes a disk drive housing having disk drive housing members, such as a disk drive base 16 and a cover 18. The disk drive base 16 and the cover 18 collectively house at least one magnetic disk 20. While two disks 20 are shown, a single disk of multiple disks may be provided. Each disk 20 contains a plurality of tracks for storing data. The tracks are disposed upon opposing first and second disk surfaces 22, 24 of the disk 20 that extend between an inner disk edge 26 (associated with the inner diameter) and an outer disk edge 28 (associated with the outer diameter) of the disk 20. The head disk assembly 12 further includes a spindle motor 30 for rotating the disk 20. The head disk assembly 12 further includes a head stack assembly 32 rotatably attached to the disk drive base 16 in operable communication with the disks 20. The head stack assembly 32 includes a rotary actuator 34.

The actuator 34 includes an actuator body 36 and actuator arms (for ease of illustration, only a topmost one being denoted 38) that extend from the actuator body 36. Distally attached to the actuator arms 38 are suspension assemblies (the topmost one denoted 40). The suspension assemblies 40 respectively support sliders (the topmost one denoted 42). Each of the sliders 42 includes a transducer head. The suspension assemblies 40 with the sliders 42 are referred to as head gimbal assemblies. It is contemplated that the number of actuator arms and suspension assemblies may vary depending upon the number of disks and disk surfaces utilized.

The actuator body 36 includes a bore, and the actuator 34 further includes a pivot bearing cartridge 44 engaged within the bore for facilitating the actuator body 36 to rotate between limited positions about an axis of rotation 46. The actuator 34 further includes a coil support 48 that extends from one side of the actuator body 36 opposite the actuator arms 38. The coil support 48 is configured to support a coil 50.

A pair of magnetic elements 52, 54 is supported by mounts 56, 58 which are attached to the disk drive base 16 (magnetic element 54 is indicated by the dashed lead line and it is understood the magnetic element 54 is disposed underneath the mount 58). The coil 50 interacts with the magnetic elements 52, 54 to form a voice coil motor for controllably rotating the actuator 34.

The head stack assembly 32 further includes a flex circuit assembly 60 and a cable connector 62. The cable connector 62 is attached to the disk drive base 16 and is disposed in electrical communication with the printed circuit board 14. The flex circuit 60 supplies current to the actuator coil 52 and carries signals between the transducer heads 42 and the printed circuit board assembly 14.

Figure 2:
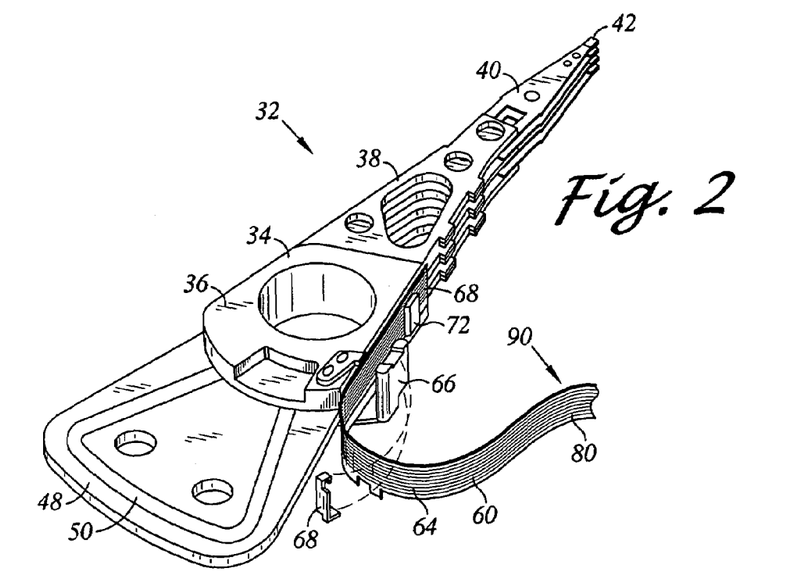
FIG. 2 is an enlarged perspective view of a head stack assembly of FIG. 1 including a flex circuit assembly with a flex circuit and integrated circuit device.

Referring additionally now to FIG. 2, there is depicted an enlarged perspective view of the head stack assembly 32. The flex circuit assembly 60 includes a flex circuit 64 (also referred to as a flex circuit cable). The flex circuit 64 includes a dynamic loop portion that is supported by a cable guide 66. As shown in exploded view, a clip 68 may be used to secure the flex circuit 60. This configuration permits relatively free rotation of the overall head stack assembly 32. Opposite the cable connector 62 the flex circuit 64 includes a mounting portion 70 which is attached to a side of the actuator body 36.

Though not shown, the flex circuit 64 contains a terminal pad portion adjacent to the mounting portion 70 for connecting the flex circuit 64 to electrical connectors, such as insulated wires. Such electrical connectors extend along the actuator arms 38 to each of the sliders 42 for transmitting data signals to and from the transducer heads. Adjacent to the mounting portion 70 of the flex circuit 64, there is attached an integrated circuit in the form of an integrated circuit device 72. The integrated circuit device 72 includes a preamplifier for enhancing the signals from the transducer heads.

Figure 3:
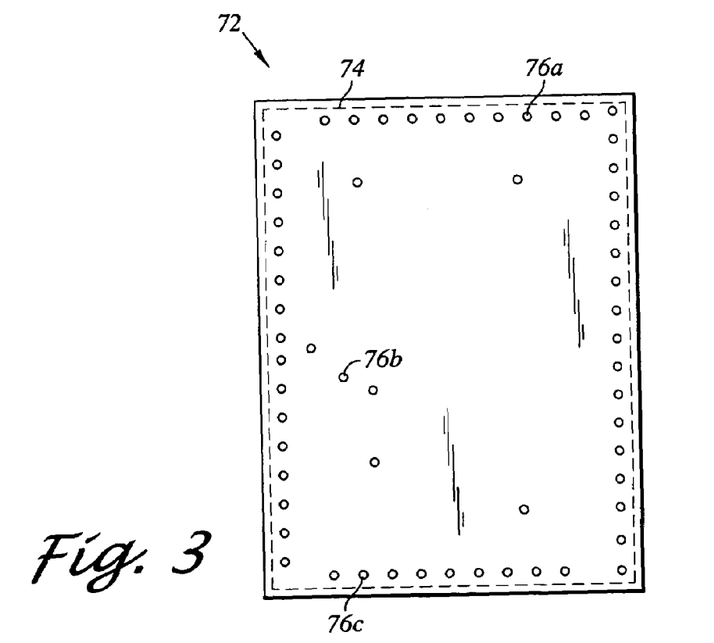
FIG. 3 is a plan view of the integrated circuit device having solder bump connections of FIG. 3.

FIG. 3 is an enlarged plan view of the integrated circuit device 72. An opposite side of the integrated circuit device 72 is show from that which is depicted in FIG. 2. The integrated circuit device 72 includes a die 74 (indicated in dashed line) and a plurality of solder bump connections (selected ones being denoted 76a–c) electrically connected to the die 74.

Figure 4:
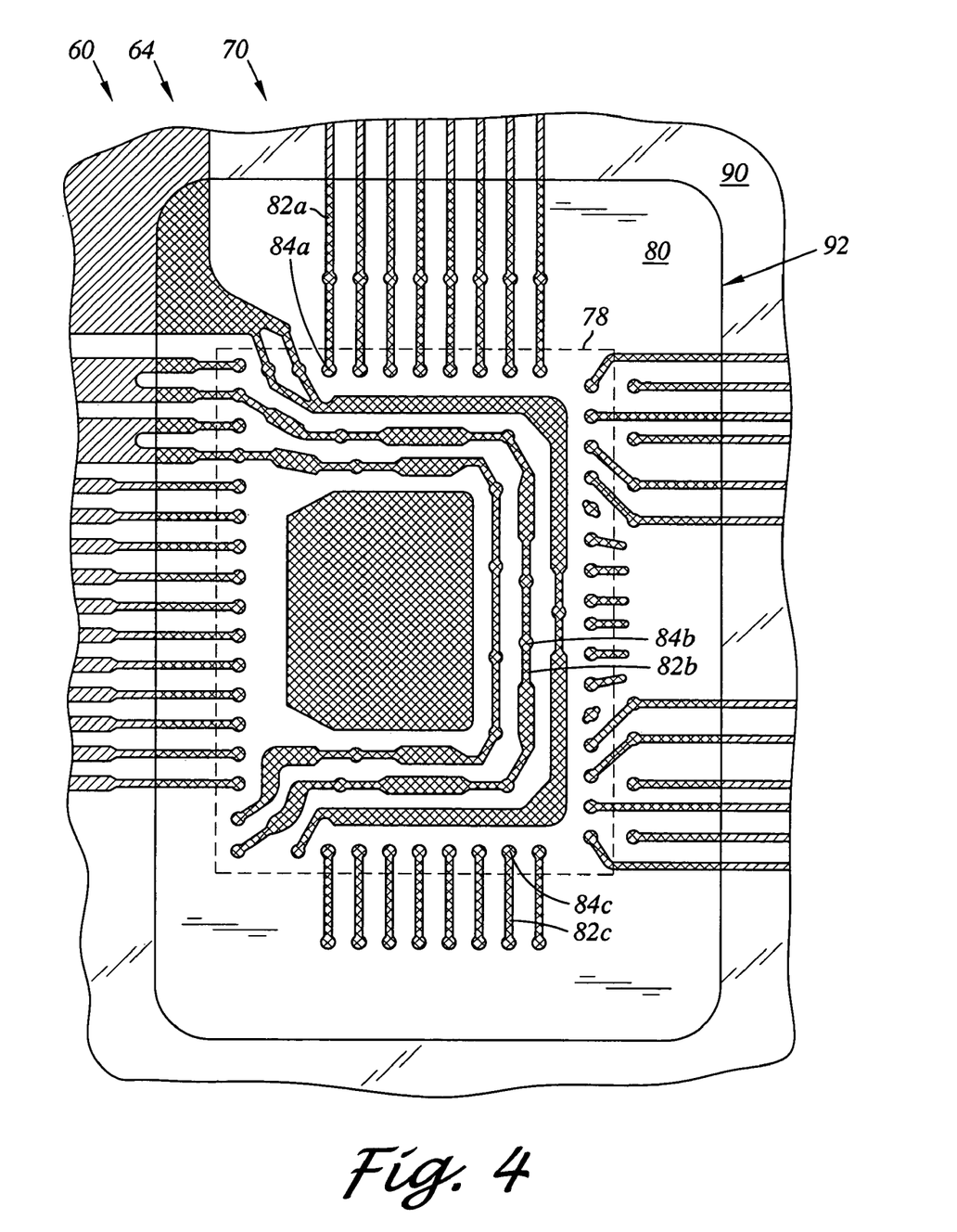
FIG. 4 is an enlarged plan view of a mounting portion of the flex circuit assembly of FIG. 2 shown without the integrated circuit device installed (however with the integrated circuit device installed location is indicated in dashed line)

Referring now to FIG. 4 there is depicted an enlarged plan view of the mounting portion 70 of the flex circuit 64 of the flex circuit assembly 60 of FIG. 2 shown without the integrated circuit device 72 installed. The location of the integrated circuit device 72 as it would be installed is indicated with dashed lines as 78.

Figure 6:
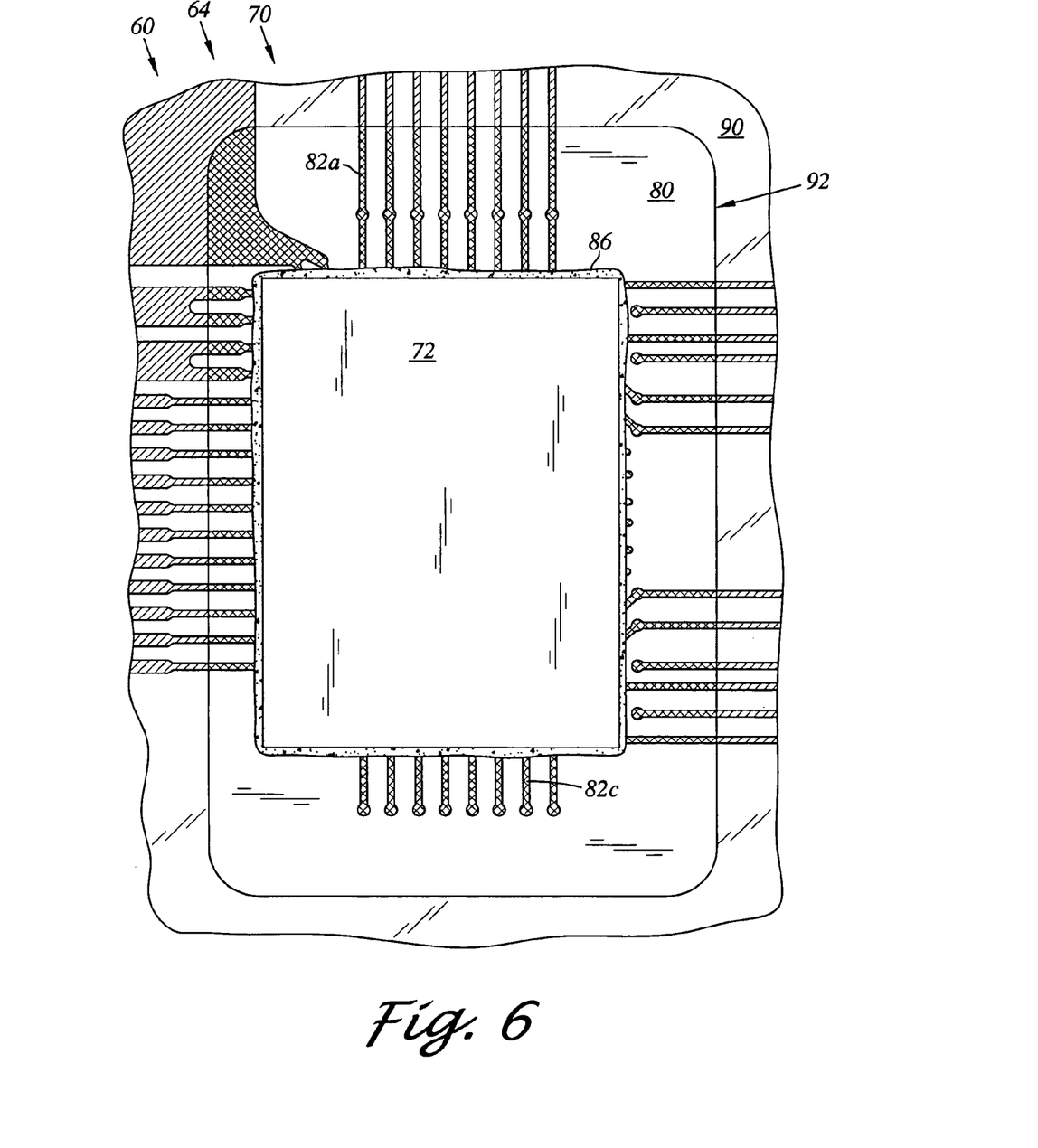
FIG. 6 is the plan view of the mounting portion of the flex circuit assembly of FIG. 5 with the integrated circuit device attached to the base film over the underfill portion with portions of the underfill portion shown about the integrated circuit device.
Figure 7:
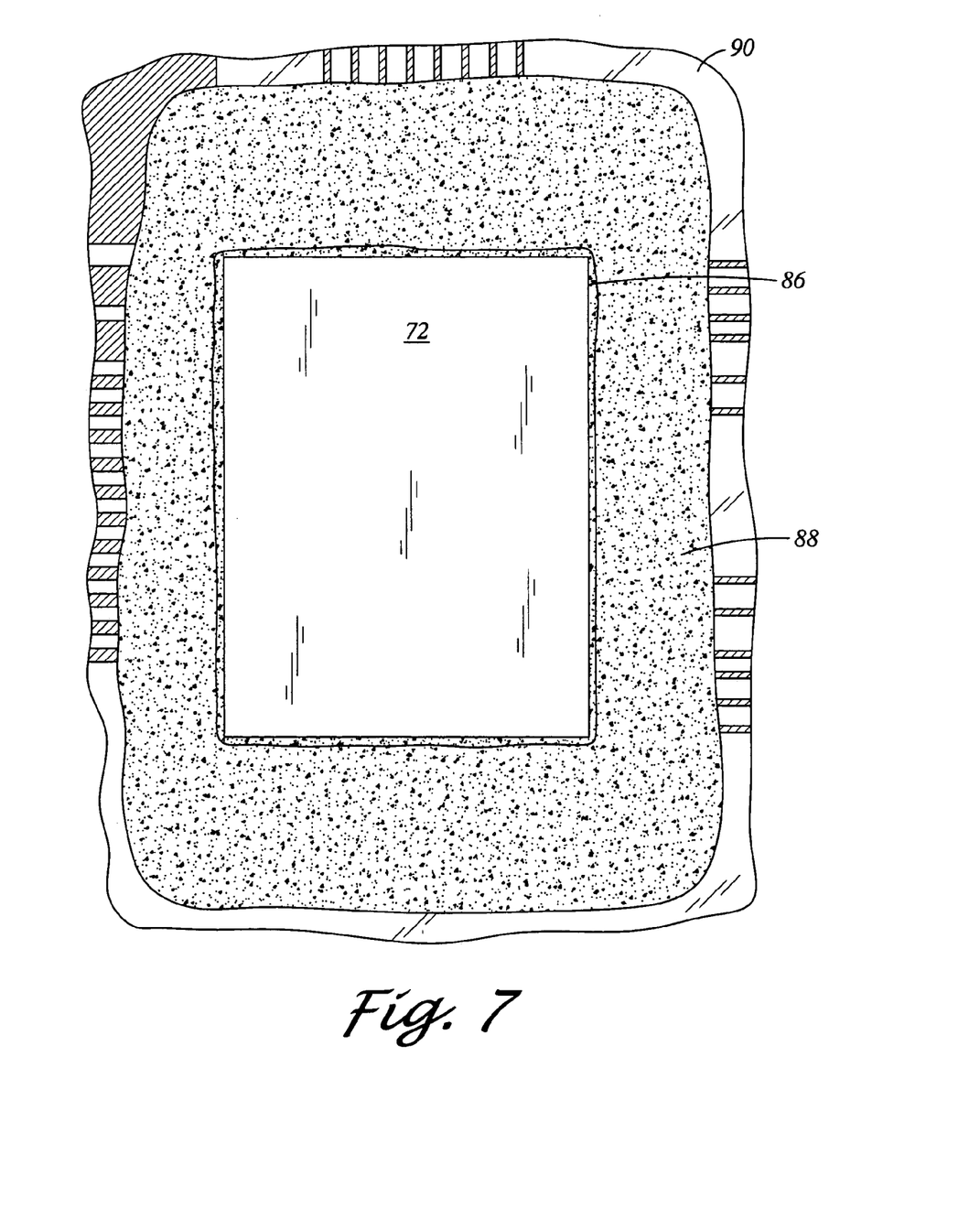
FIG. 7 is a plan view of the mounting portion of the flex circuit assembly of FIG. 6 with a glob top portion disposed about the integrated circuit device over the base film and the underfill portion.
Figure 8:
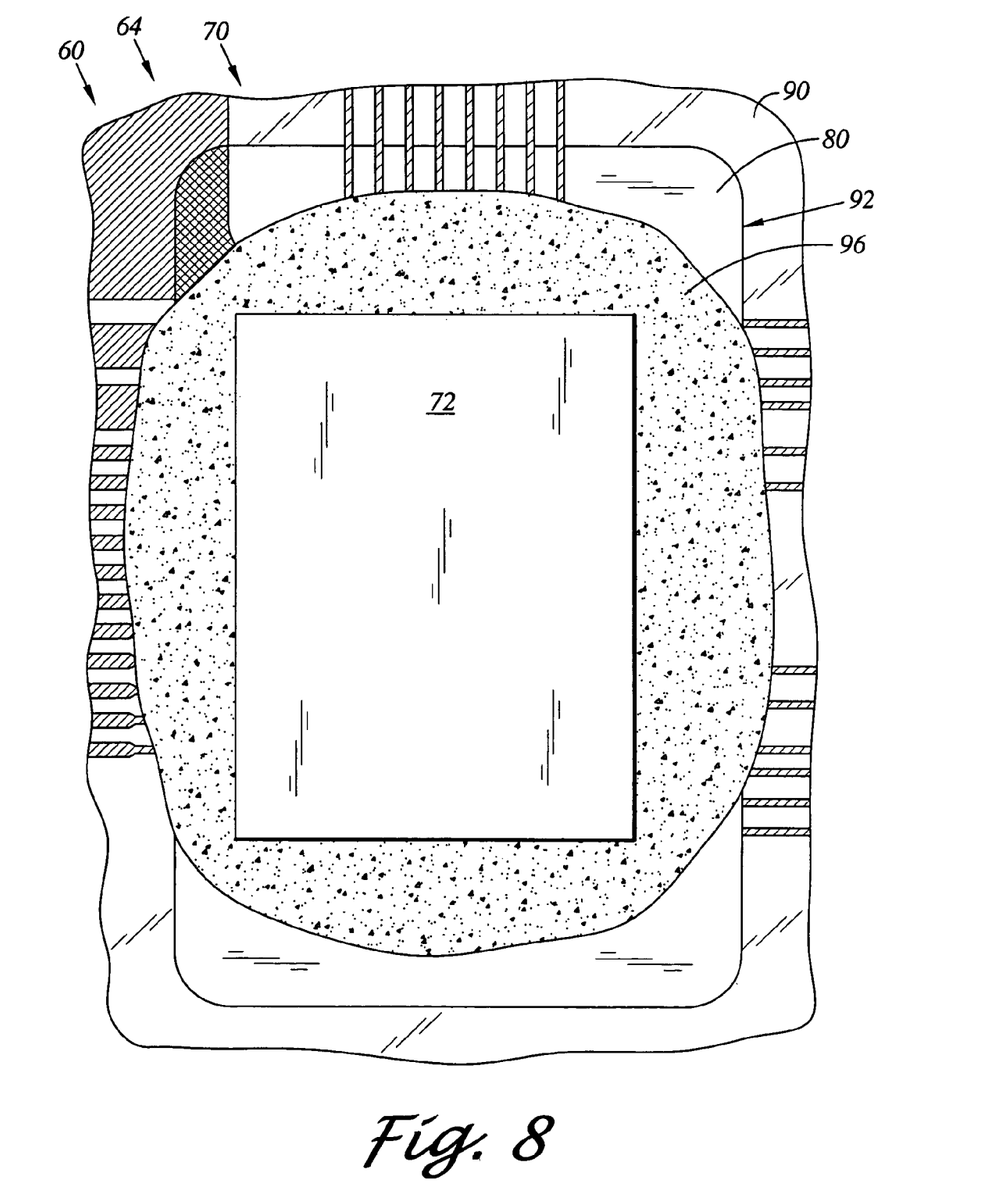
FIG. 8 is the plan view of the mounting portion of the flex circuit assembly of FIG. 4 with an underfill portion in the form of a capillary flow encapsulant disposed upon a base film of the flex circuit assembly according to another embodiment of an aspect of the present invention.

An aspect of the present invention can be regarded as the flex circuit assembly 60 for use in the head stack assembly 32. The flex circuit assembly 60 includes a flex circuit base film 80. The flex circuit assembly 60 further includes the integrated circuit device 72 disposed adjacent the flex circuit base film 80. The integrated circuit device 72 includes a solder bump connection, such as 76a of 76a–c. The flex circuit assembly 60 further includes an electrically conductive trace, such as 82a (selected ones being denoted 82a–c), disposed upon the flex circuit base film 80. The trace 82a includes a contact pad 84a. With the integrated circuit device installed (such as shown in FIGS. 1, 2 and 7) the contact pad 84a is electrically connected to the solder bump connection 76a. As shown in FIGS. 6 and 7, the flex circuit assembly 60 further includes an underfill portion 86 disposed between the flex circuit base film 80 and the integrated circuit device 72 for attaching the integrated circuit device 72 to the flex circuit base film 80. The underfill portion 86 is formed of an underfill material. As shown in FIG. 8, the flex circuit assembly 60 further includes a glob top portion 88 disposed upon the underfill portion 86 and the flex circuit base film 80 for sealing the electrically conductive trace 82a. The glob top portion 88 is formed of a glob top material, and the glob top material is different than the underfill material.

In further detail, the electrically conductive traces (selected ones being denoted 82a–c) include contact pads (selective ones being denoted 84a–c which respectively correspond to the traces 82a–c). The configuration of the contact pads 84a–c is designed to correspond to the solder bump connections 76a–c of the integrated circuit device 72. The integrated circuit device 72 may have a variety of electrical connection configurations such as flip chip, BGA (ball grid array), sBGA (super BGA) and µBGA (micro BGA). It is understood that the integrated circuit device 72 may be of an integrated circuit package or a bare die design.

Referring now to FIGS. 4–7 there is sequentially illustrated an embodiment of an installation process of the integrated circuit device 72. The process includes provision of the flex circuit 64 as shown in FIG. 4. As mentioned above, the flex circuit 64 includes the flex circuit base film 80. The flex circuit 64 may further include a flex circuit cover film 90 disposed upon the flex circuit base film 80. The flex circuit base film 80 and the flex circuit cover film 90 may be formed of a polyimide material. The traces 82a–c are disposed between the flex circuit base film 80 and the flex circuit cover film 90. In this regard, the flex circuit cover film 90 is used to electrically insulate the traces 82a–c. The flex circuit cover film 90 may include an opening 92. In this regard, portions of the traces 82a–c may be selective disposed within the opening 92 and therefore initially exposed.

Figure 5:
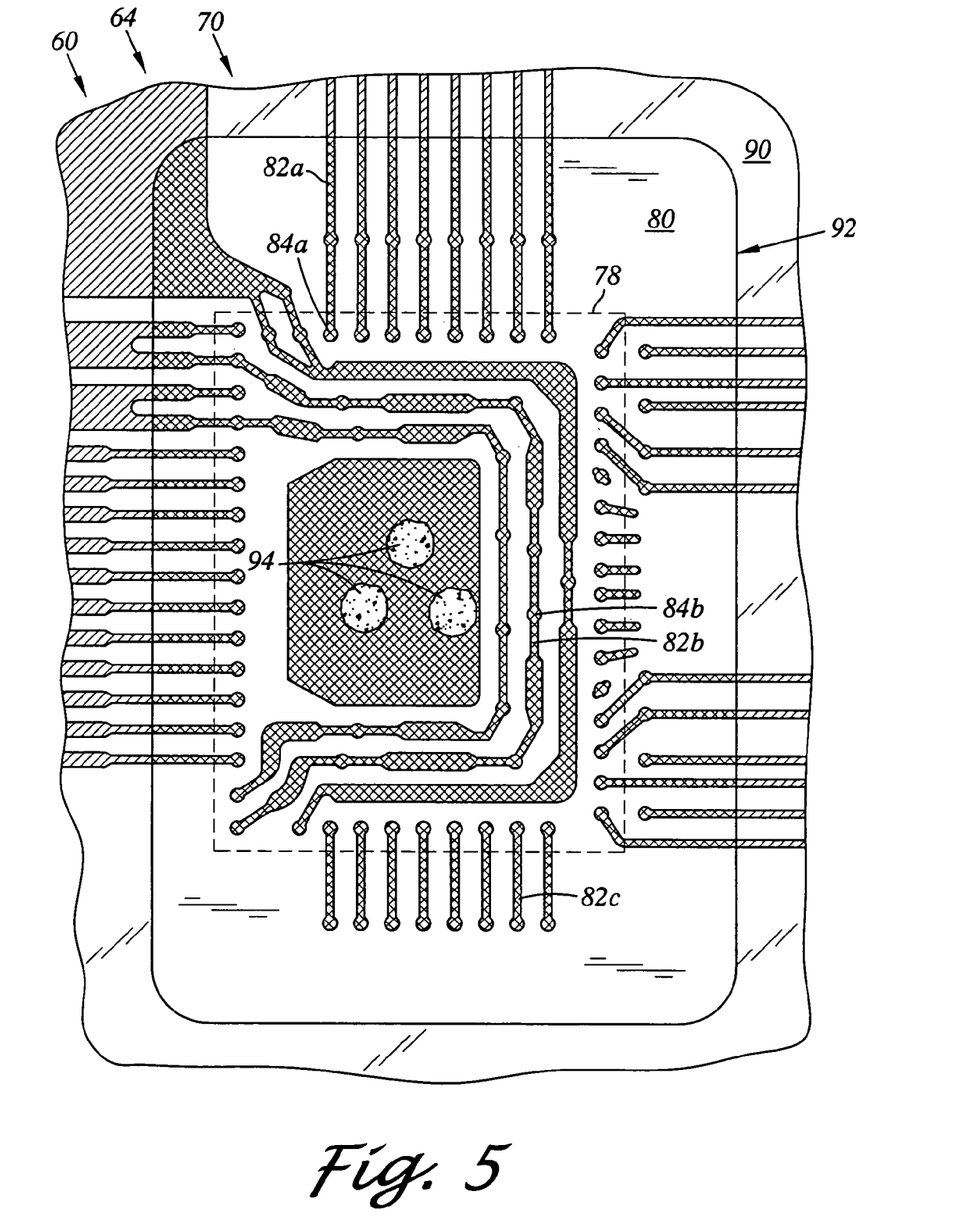
FIG. 5 is the plan view of the mounting portion of the flex circuit assembly of FIG. 4 with an underfill portion in the form of a no-flow encapsulant disposed upon a base film of the flex circuit assembly according to an embodiment of an aspect of the present invention.

Referring now to FIG. 5 there is depicted the plan view of the mounting portion 70 of the flex circuit assembly 60 of FIG. 4 with the underfill material used to form the underfill portion 86 shown as initially deposited in three discrete droppings 94. The underfill material may be initially dispensed in any configuration so as to provide the desired coverage. The underfill material may be relatively expensive, and therefore it is preferable to carefully dispense the underfill material injudicious amounts. In this embodiment the underfill material is a no-flow encapsulant. A suitable no-flow encapsulant may include No-Flow Underfill UF-3400 (manufactured by 3M, Adhesives Division, of St. Paul, Minn.). The underfill material may be an epoxy which may or may not include a filler.

The underfill portion 86 may have a coefficient of thermal expansion between the coefficients of thermal expansion of the integrated circuit device 72 and the flex circuit base film 80. Further, the underfill portion 86 may have a coefficient of thermal expansion greater than a coefficient of thermal expansion of the glob top portion 88. For example, the underfill portion 86 may have a coefficient of thermal expansion between 30–45 parts per million per degree centigrade. This provides good matching with solder coefficient of thermal expansion, good adhesion qualities, and workability in cases of low underfill gaps.

Referring now to FIG. 6 there is depicted the plan view of the mounting portion 70 of the flex circuit assembly 60 of FIG. 5 with the integrated circuit device 72 attached to the flex circuit base film 80 within the opening 92. In attaching the integrated circuit device 72 to the flex circuit base film 80, the integrated circuit device 72 is pressed against the droppings 94 and the underfill material is squeezed outwardly along the flex circuit base film 80 to form the underfill portion 86. While the underfill portion 86 is shown about the integrated circuit device 72 is it understood that it also extends below the integrated circuit device 72 between the integrated circuit device 72 and the flex circuit base film 80.

Referring now to FIG. 7 there is depicted a plan view of the mounting portion 70 of the flex circuit assembly 60 of FIG. 6 with the glob top portion 88 disposed about the integrated circuit device 72 over the flex circuit base film 80 and the underfill portion 86. The glob top portion 88 is preferably disposed about the entire periphery of the opening 92. In this respect sealing of all of the traces 82a–c is ensured. Unlike the underfill material, the glob top material is contemplated to be relatively inexpensive. The underfill material may be significantly more expensive than the glob top material. A suitable glob top material may include Hysol® FP4323 (ES4323) (manufactured by Henkel Loctite Corporation, Loctite Electronics, of Industry, California). The glob top material may be an epoxy which includes fillers. The fillers may be of an alumina or silica type. The glob top material is generally characterized as not including any capillary action when applied. The glob top material is further generally characterized in the art as not being suitable for underfill applications.

Figure 9:
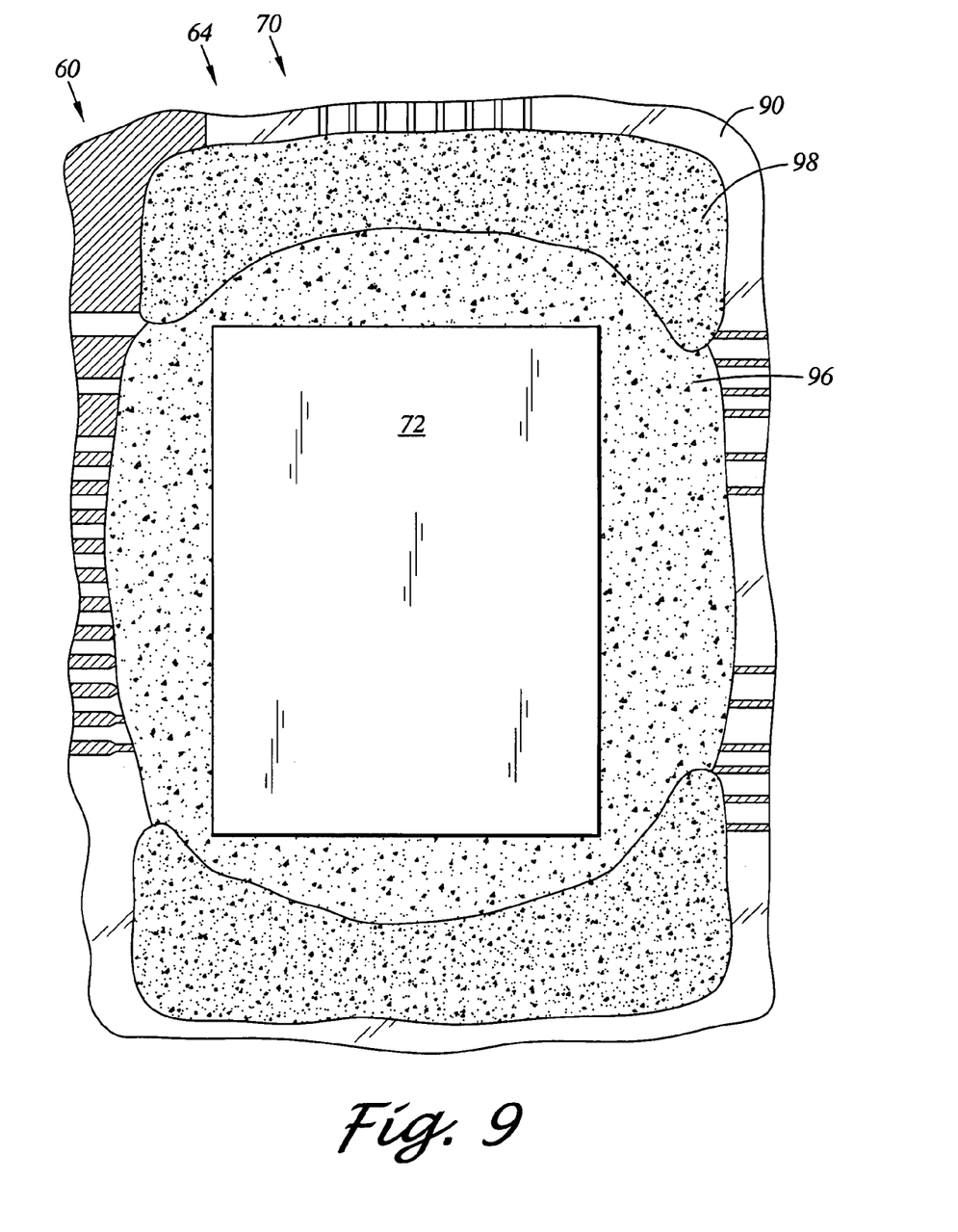
FIG. 9 is a plan view of the mounting portion of the flex circuit assembly of FIG. 8 with a glob top portion disposed about the integrated circuit device over the base film and the underfill portion.

Referring now to FIGS. 8 and 9 there is depicted another embodiment of the present invention with differences noted in comparison to the embodiment illustrated in FIGS. 5–7. The underfill material may a capillary flow encapsulant. In this regard, FIG. 8 is the plan view of the mounting portion 70 of the flex circuit assembly 60 of FIG. 4 with an underfill portion 96 in the form of a capillary flow encapsulant. It is contemplated that the integrated circuit device 72 is disposed upon the flex circuit base film 80. Once in place, the underfill material in the form of a capillary flow encapsulant is deposited upon the flex circuit base film 80 adjacent the integrated circuit device 72. Through a capillary action, the underfill material is wicked under the integrated circuit device 72 between the integrated circuit device 72 and the flex circuit base film 80 for forming an underfill portion 96. A suitable capillary flow encapsulant may include Hysol® FP4526 or 4530 (manufactured by Henkel Loctite Corporation, Loctite Electronics, of Industry, California).

Referring now to FIG. 9 there is depicted a plan view of the mounting portion 70 of the flex circuit assembly 60 of FIG. 8 with a glob top portion 98 disposed about the integrated circuit device 72 over the flex circuit base film 80 and the underfill portion 96. The glob top portion 98 may be formed of a glob top material as discussed above.

According to another aspect of the invention there is provided the head stack assembly 32 for use with the disk drive 10. The head stack assembly 32 includes a rotary actuator 34 and the above described flex circuit assembly 60 attached to the rotary actuator 34. According to another aspect of the invention there is provided the disk drive 10. The disk drive 10 includes the disk drive base 16 and the above described head stack assembly 32 rotatably coupled to the disk drive base 16.

I claim:

1. A flex circuit assembly for use in a head stack assembly, the flex circuit assembly comprising
   a flex circuit base film;
   an integrated circuit device including a top surface and a bottom surface, the bottom surface disposed adjacent the flex circuit base film and including a solder bump connection;
   an electrically conductive trace disposed upon the flex circuit base film, the trace including a contact pad, the contact pad electrically connected to the solder bump connection;
   a flex circuit cover film disposed upon the flex circuit base film, the flex circuit cover film including an opening, the integrated circuit device and the electrically conductive trace being disposed within the opening;
   an underfill portion disposed between the flex circuit base film and the integrated circuit device within the opening for attaching the integrated circuit device to the flex circuit base film, the underfill portion being formed of an underfill material, the electrically conductive trace including uncovered portions that are not covered by any of the integrated circuit device and the underfill portion within the opening; and
   a glob top portion disposed upon the underfill portion and the flex circuit base film and completely covering the uncovered portions of the electrically conductive trace, the glob top portion not being disposed upon the top surface of the integrated circuit device, the glob top portion being formed of a glob top material, the glob top material being different than the underfill material.

2. The flex circuit assembly of claim 1 wherein the underfill material is a no-flow encapsulant.

3. The flex circuit assembly of claim 1 wherein the underfill material is a capillary flow encapsulant.

4. The flex circuit assembly of claim 1 wherein the underfill portion has a coefficient of thermal expansion between coefficients of thermal expansion of the integrated circuit device and the flex circuit base film.

5. The flex circuit assembly of claim 1 wherein the underfill portion has a coefficient of thermal expansion greater than a coefficient of thermal expansion of the glob top portion.

6. A head stack assembly for use in a disk drive, the head stack assembly comprising:
   a rotary actuator; and
   a flex circuit assembly attached to the rotary actuator, the flex circuit assembly including:
   a flex circuit base film;
   an integrated circuit device including a top surface and a bottom surface, the bottom surface disposed adjacent the flex circuit base film and including a solder bump connection;
   an electrically conductive trace disposed upon the flex circuit base film, the trace including a contact pad, the contact pad electrically connected to the solder bump connection;
   a flex circuit cover film disposed upon the flex circuit base film, the flex circuit cover film including an opening, the integrated circuit device and the electrically conductive trace being disposed within the opening
   an underfill portion disposed between the flex circuit base film and the integrated circuit device within the opening for attaching the integrated circuit device to the flex circuit base film, the underfill portion being formed of an underfill material, the electrically conductive trace including uncovered portions that are not covered by any of the integrated circuit device and the underfill portion within the opening; and
   a glob top portion disposed upon the underfill portion and the flex circuit base film and completely covering the uncovered portions of the electrically conductive trace, the glob top portion not being disposed upon the top surface of the integrated circuit device, the glob top portion being formed of a glob top material, the glob top material being different than the underfill material.

7. The head stack assembly of claim 6 wherein the underfill material is a no-flow encapsulant.

8. The head stack assembly of claim 6 wherein the underfill material is a capillary flow encapsulant.

9. The head stack assembly of claim 6 wherein the underfill portion has a coefficient of thermal expansion between coefficients of thermal expansion of the integrated circuit device and the flex circuit base film.

10. The head stack assembly of claim 6 wherein the underfill portion has a coefficient of thermal expansion greater than a coefficient of thermal expansion of the glob top portion.

11. A disk drive comprising:
    a disk drive base; and
    a head stack assembly rotatably coupled to the disk drive base, the head stack assembly including:
    a rotary actuator; and
    a flex circuit assembly attached to the rotary actuator, the flex circuit assembly including:
    a flex circuit base film;
    an integrated circuit device including a top surface and a bottom surface, the bottom surface disposed adjacent the flex circuit base film and including a solder bump connection;
    an electrically conductive trace disposed upon the flex circuit base film, the trace including a contact pad, the contact pad electrically connected to the solder bump connection;
    a flex circuit cover film disposed upon the flex circuit base film, the flex circuit cover film including an opening the integrated circuit device and the electrically conductive trace being disposed within the opening
    an underfill portion disposed between the flex circuit base film and the integrated circuit device within the opening for attaching the integrated circuit device to the flex circuit base film, the underfill portion being formed of an underfill material, the electrically conductive trace including uncovered portions that are not covered by any of the integrated circuit device and the underfill portion within the opening; and a glob top portion disposed upon the underfill portion and the flex circuit base film and completely covering the uncovered portions of the electrically conductive trace, the glob top portion not being disposed upon the top surface of the integrated circuit device, the glob top portion being formed of a glob top material, the glob top material being different than the underfill material.

12. The disk drive of claim 11 wherein the underfill material is a no-flow encapsulant.

13. The disk drive of claim 11 wherein the underfill material is a capillary flow encapsulant.

14. The disk drive of claim 11 wherein the underfill portion has a coefficient of thermal expansion between coefficients of thermal expansion of the integrated circuit device and the flex circuit base film.

15. The disk drive of claim 11 wherein the underfill portion has a coefficient of thermal expansion greater than a coefficient of thermal expansion of the glob top portion.

* * * * *